US008053758B2

(12) United States Patent
Yamauchi et al.

(10) Patent No.: US 8,053,758 B2
(45) Date of Patent: Nov. 8, 2011

(54) SEMICONDUCTOR DEVICE

(75) Inventors: Takashi Yamauchi, Kanagawa (JP);
Yoshifumi Nishi, Kanagawa (JP);
Hiroto Honda, Kanagawa (JP); Kei Masunishi, Kanagawa (JP); Shinji Murai, Kanagawa (JP); Masumi Saitoh, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 12/549,140

(22) Filed: Aug. 27, 2009

(65) Prior Publication Data
US 2010/0051906 A1 Mar. 4, 2010

(30) Foreign Application Priority Data

Aug. 29, 2008 (JP) ................. 2008-222180

(51) Int. Cl.
*H01L 29/08* (2006.01)
*H01L 29/15* (2006.01)
*H01L 31/0352* (2006.01)
*H01L 31/0256* (2006.01)
*H01L 31/0232* (2006.01)
(52) U.S. Cl. ............. 257/14; 257/21; 257/E31.093; 257/E31.033
(58) Field of Classification Search .......... None
See application file for complete search history.

(56) References Cited

U.S. PATENT DOCUMENTS

| | | | | |
|---|---|---|---|---|
| 6,124,179 A * | 9/2000 | Adamic, Jr. | ............ | 438/309 |
| 7,235,832 B2 * | 6/2007 | Yaung | ............ | 257/292 |
| 7,259,364 B2 * | 8/2007 | Lule | ............ | 250/214.1 |
| 7,531,884 B2 * | 5/2009 | Kim | ............ | 257/440 |
| 7,535,073 B2 * | 5/2009 | Ezaki | ............ | 257/440 |
| 7,588,993 B2 * | 9/2009 | Liu et al. | ............ | 438/401 |
| 7,659,595 B2 * | 2/2010 | Shiau et al. | ............ | 257/459 |
| 7,687,872 B2 * | 3/2010 | Cazaux et al. | ............ | 257/447 |

(Continued)

FOREIGN PATENT DOCUMENTS

JP 2008-054754 3/2008

OTHER PUBLICATIONS

Bandyopadhyay, S., K. Karahalilolu, S. Balkir, and S. Pramanik. "Computational Paradigm for Nanoelectronics: Self-assembled Quantum Dot Cellular Neural Networks." IEE Proceedings—Circuits, Devices and Systems 152.2 (2005): 85. Print.*

(Continued)

*Primary Examiner* — Benjamin Sandvik
*Assistant Examiner* — Joseph Schoenholtz
(74) *Attorney, Agent, or Firm* — Finnegan, Henderson, Farabow, Garrett & Dunner, L.L.P.

(57) ABSTRACT

A semiconductor device for correcting an input signal and outputting a corrected signal are provided. The semiconductor device includes a semiconductor layer, a plurality of first conductors formed on one of faces of the semiconductor layer and serving as input terminals to which a signal is input, second conductors of the number larger than that of the first conductors at density higher than that of the first conductors, formed on the other face of the semiconductor layer, a high impurity concentration region provided on the semiconductor layer side of an interface between the second conductor and the semiconductor layer, an insulating layer formed on the other face, and a plurality of third conductors formed on the insulating layer and serving as output terminals for outputting the processed signal.

20 Claims, 21 Drawing Sheets

U.S. PATENT DOCUMENTS

| | | | |
|---|---|---|---|
| 7,714,403 B2* | 5/2010 | Lee et al. | 257/432 |
| 7,718,965 B1* | 5/2010 | Syllaios et al. | 250/338.1 |
| 7,888,763 B2* | 2/2011 | Qian et al. | 257/460 |
| 2007/0001100 A1* | 1/2007 | Hsu et al. | 250/214.1 |
| 2007/0091190 A1* | 4/2007 | Iwabuchi et al. | 348/294 |
| 2007/0259463 A1* | 11/2007 | Abedini | 438/22 |
| 2008/0017893 A1* | 1/2008 | Cazaux et al. | 257/233 |
| 2008/0224247 A1* | 9/2008 | Hsu et al. | 257/432 |
| 2009/0212385 A1* | 8/2009 | Ohkubo et al. | 257/443 |

OTHER PUBLICATIONS

Roychowdhury, V.P.; Janes, D.B.; Bandyopadhyay, S.; Xiaodong Wang; , "Collective computational activity in self-assembled arrays of quantum dots: a novel neuromorphic architecture for nanoelectronics," Electron Devices, IEEE Transactions on , vol. 43, No. 10, pp. 1688-1699, Oct. 1996.*

* cited by examiner

SEMICONDUCTOR DEVICE

CROSS-REFERENCE TO RELATED APPLICATION

This application is based upon and claims the benefit of priority from Japanese Patent Application No. 2008-222180, filed on Aug. 29, 2008, the entire contents of which are incorporated herein by reference.

TECHNOLOGY FIELD

Exemplary embodiments described herein relates to a semiconductor device for correcting an input signal and outputting a corrected signal.

BACKGROUND

A solid-state image sensing device is a photoelectric conversion element formed in an integrated circuit by using a technique of manufacturing a semiconductor device. As a transferring device for outputting charges generated by a photodiode as the photoelectric conversion element, a charge coupled device (CCD) or a CMOS device are used. Depending on the difference between the devices, an image sensor is called a CCD image sensor or a CMOS image sensor.

FIG. 37 is across section of a general CMOS image sensor. In the CMOS image sensor, a plurality of unit cells (pixels) are formed on an Si substrate 90. In each of the unit cells (pixels) in the CMOS image sensor, a color filter 94 is formed below a microlens 92. Through a metal wiring layer 96 below the color filter 94, light is focused in a photodiode 99 formed in a P-well 98 in the Si substrate 90. Some field effect transistors such as a transistor for transferring charges generated by the photodiode 99 and converting to voltage are formed on the semiconductor substrate for every unit cell. And those transistors are connected to wires of the metal wiring layer 96.

The CMOS image sensor has an amplification transistor for each pixel. Therefore it has a feature that occurrence of electric noise caused by reading of a photoelectric-converted electric signal is suppressed. Since mass production is possible by applying the LSI manufacturing process, the CMOS image sensor is cheaper than the CCD image sensor having a high-voltage analog circuit. The CMOS image sensor has advantages such that, since the device is smaller, power consumption is low, and no smear or blooming occurs in principle. In recent years, utilizing the feature, the CMOS image sensor is applied to a cellular phone or a high-grade digital single-lens reflex camera.

One of important development challenges of a CMOS image sensor is increase in sensitivity. For higher sensitivity, scaling down of a pixel is effective means. By using the wiring technique in the LSI field, wires at a 1.5 μm pitch or less can be manufactured. However, there is limitation in diffraction of light which occurs when light passes through a metal wiring layer and is focused on the photodiode. It is therefore expected to become difficult to realize scaling down of a pixel itself, when the size of a pixel becomes smaller than 1.5 μm.

To solve the problem, a backside illumination CMOS image sensor has been proposed in recent years. By using this method, light is not focused through the metal wiring layer, so that the problem of the diffraction limitation can be avoided. In addition, the region of the photodiode in a pixel can be sufficiently assured, and a pixel can be miniaturized to the size of about the wavelength of light. However, even when a backside illumination CMOS image sensor is employed, it is difficult to make a pixel smaller than 0.6 μm as the wavelength of red light.

There is an image correcting technique as a technique for realizing a higher-precision image without increasing the number of pixels. In the technique, correction such as successive complementation, edge reinforcement, or the like on a signal of each pixel by software or hardware means is performed to make an output image closer to a real object.

JP-A 2008-54754 (KOKAI) discloses a technique for correcting an image by hardware means using a nonlinear device.

SUMMARY

A semiconductor device as a first embodiment of the present invention includes: a semiconductor layer; a plurality of first conductors formed on one of faces of the semiconductor layer and configured to serve as input terminals to which signals are input; a plurality of second conductors formed on the other face of the semiconductor layer, wherein the number of the second conductors is larger than that of the first conductors and the number density of the second conductors is higher than that of the first conductors; high impurity concentration regions provided on the semiconductor layer side of interfaces between the second conductors and the semiconductor layer; an insulating layer formed on the second conductors; and a plurality of third conductors formed on the insulating layer and configured to serve as output terminals from which the signals processed are output.

A semiconductor device as a second embodiment of the present invention includes: a semiconductor substrate; a solid-state image sensing device formed on one of main faces of the semiconductor substrate; a semiconductor layer on the other main face of the semiconductor substrate; a plurality of first conductors penetrating the semiconductor substrate, connected to one of faces of the semiconductor layer, and configured to serve as input terminals to which image signals from the solid-state image sensing device are input; a plurality of second conductors formed on the other face of the semiconductor layer, wherein the number of the second conductors is larger than that of the first conductors and the number density of the second conductors is also higher than that of the first conductors; a high impurity concentration regions provided on the semiconductor layer side of interfaces between the second conductors and the semiconductor layer; an insulating layer formed on the second conductors; and a plurality of third conductors formed on the insulating layer and configured to serve as output terminals from which the signals processed are output.

DETAILED DESCRIPTION OF THE EMBODIMENTS

Several embodiments will be described below with reference to the drawings. In the description below, a word "grain" includes both single crystalline grain and polycrystalline grain.

First Embodiment

A semiconductor device of a first embodiment includes: a semiconductor layer; a plurality of first conductors formed on one of faces of the semiconductor layer and serving as input terminals to which a signal is input; second conductors of the number larger than that of the first conductors at density higher than that of the first conductors, formed on the other face of the semiconductor layer; a high impurity concentration region provided on the semiconductor layer side of an interface between the second conductor and the semiconductor layer; an insulating layer formed on the other face; and a plurality of third conductors formed on the insulating layer and serving as output terminals for outputting the processed signal. The semiconductor device is characterized in that the high impurity concentration region is provided on the semiconductor layer side of the interface between the second conductor and the semiconductor layer.

Figure 1:
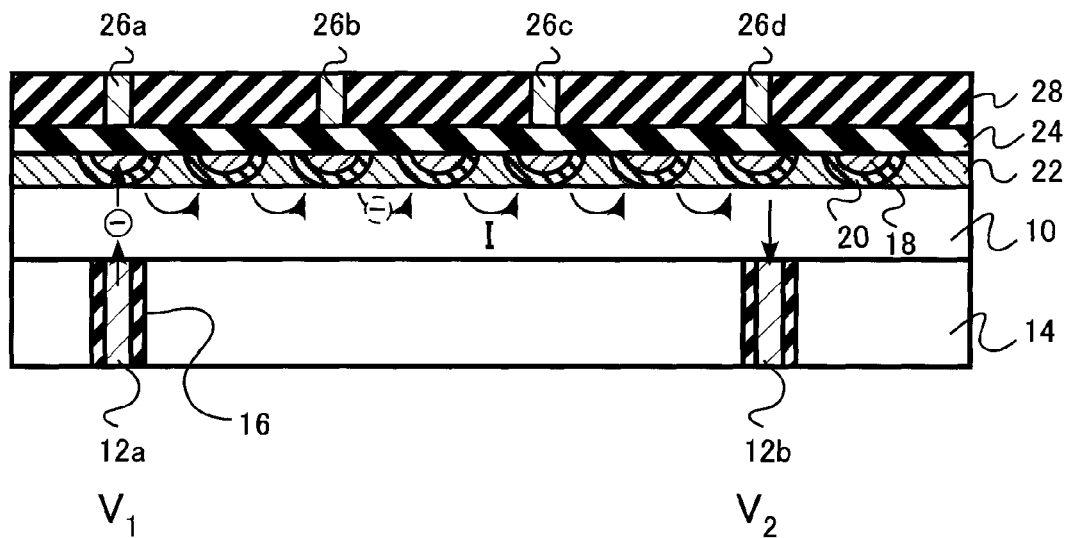
FIG. 1 is a cross section of a semiconductor device of a first embodiment.

FIG. 1 is a cross section of a semiconductor device of the first embodiment. For example, on the under face of a semiconductor layer 10 of n-type Si (silicon) having an impurity concentration of about $1\times10^{15}$ atoms/cm$^3$, input terminals 12a and 12b having a plug structure made of a metal such as Ni or Al are formed. In FIG. 1, the input terminals 12a and 12b are provided in a semiconductor substrate 14 of Si or the like with an insulating layer 16 which is, for example, a silicon oxide film. The input terminals 12a and 12b are electrically connected to the semiconductor layer 10. A diffusion layer of the n type or p type may be provided on the semiconductor layer 10 side of the input terminals 12a and 12b.

On the top face of the semiconductor layer 10, NiSi (nickel monosilicide) grains 18 of a number larger than that of the input terminals 12a and 12b are formed at number density higher than that of the input terminals 12a and 12b. On the semiconductor layer 10 side of the interface between the NiSi grains 18 and the semiconductor layer 10, a high impurity concentration region 20 of As or the like is provided. The high concentration means that the impurity concentration near the interface is higher than that near an intermediate part between the NiSi grains 18. To effectively lower the Schottky barrier height, the concentration of the high impurity concentration region is preferably $1\times10^{20}$ atoms/cm$^3$ or higher. In the embodiment, in the entire region where the NiSi grains 18 are formed, a low impurity concentration layer 22 of about $1\times10^{18}$ atoms/cm$^3$ is formed. The existence of the low impurity concentration layer 22 is not always necessary.

Above the top face of the semiconductor layer 10 on the NiSi grains 18, for example, a high-dielectric-constant insulating film 24 is formed as an insulating layer. Further, on the high-dielectric-constant insulting film 24, a plurality of, for example, four output terminals 26a, 26b, 26c, and 26d made of a metal such as Ni or Al are formed in an insulating film 28.

Figure 2:
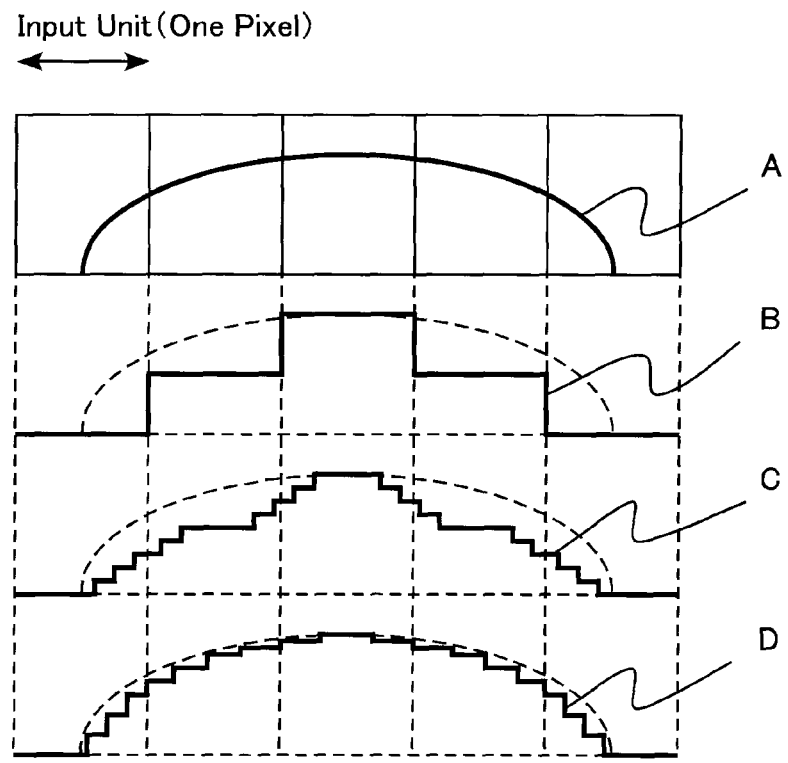
FIG. 2 is a diagram for explaining operation of the semiconductor device of the first embodiment.

FIG. 2 is a conceptual diagram for explaining the action of the semiconductor device of the embodiment. The case where an input signal is an image signal will be described as an example. In the diagram, line A shows an actual tone intensity distribution of an object to be imaged. Lines B to D show possible intensity distributions of output signals. Line B shows the case where correction is not performed. Line C shows the case where a plurality of output electrodes are simply provided for a single pixel as an input unit. Line D shows the intensity distribution of an output signal of the embodiment.

In the case where the number of electrodes on the output side is simply increased more than that of electrodes on the input side, as shown by the line C, the gaps between the pixels are just successively filled. In contrast, in the embodiment, as shown by the line D, edges are reinforced, and a process of obtaining a signal intensity distribution more approximated to the actual tone intensity distribution can be performed.

In the conceptual diagram of FIG. 2, the signal intensity distribution in the NiSi grains in FIG. 1 is shown. Consequently, to obtain a signal intensity distribution similar to the line D in FIG. 2 at an output terminal, the number of NiSi grains has to be the same as that of the output terminals. However, even in the case where the number of output terminals is smaller than that of the NiSi grains, the complementation effect by edge reinforcement can be obtained. In an extreme case, even if the number of input terminals and that of output terminals are the same, the complementation effect by edge reinforcement can be obtained, and an output image can be approximated to an actual object.

Figure 3:
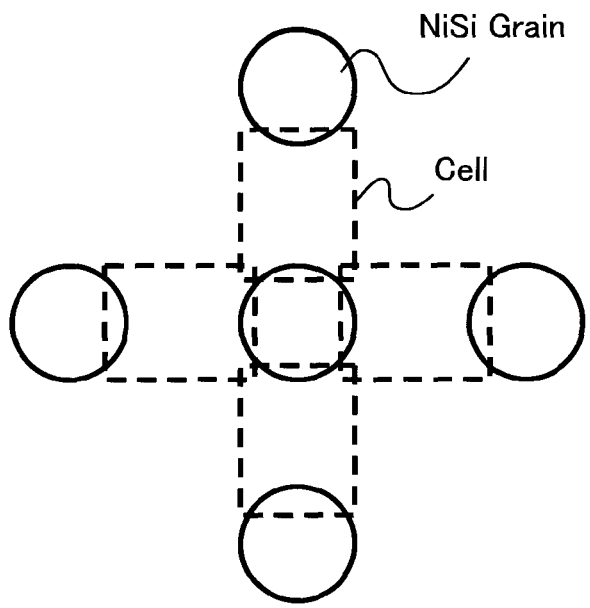
FIG. 3 is a top view of NiSi grains dispersed on a semiconductor layer in the first embodiment.

The function of the semiconductor device of the embodiment will be described more specifically. First, attention is paid to the NiSi grains dispersed on the semiconductor layer. FIG. 3 is a top view of the NiSi grains dispersed on the semiconductor layer. A region sandwiched between neighboring NiSi grains as shown in FIG. 3 will be called a cell in this specification. Therefore, in the semiconductor layer, cells form a network via the NiSi grains.

Figure 4:
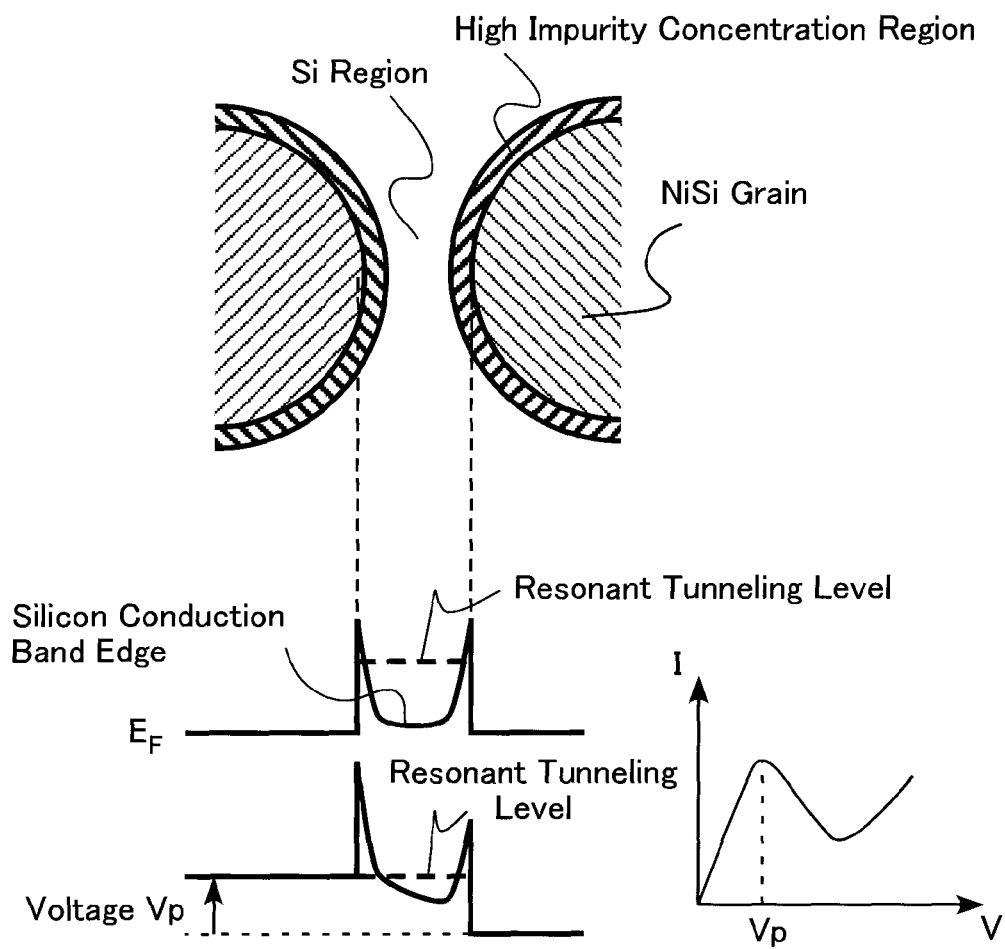
FIG. 4 is an enlarged view of a cell part in the first embodiment.
Figure 5:
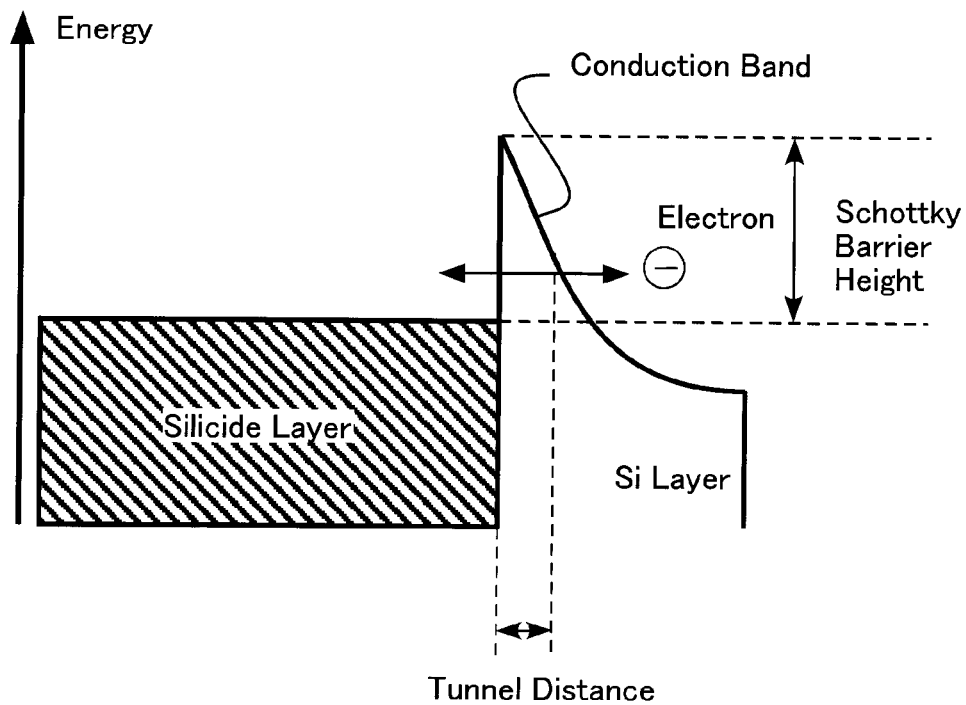
FIG. 5 is a diagram showing a band of an NiSi/Si junction.
Figure 6:
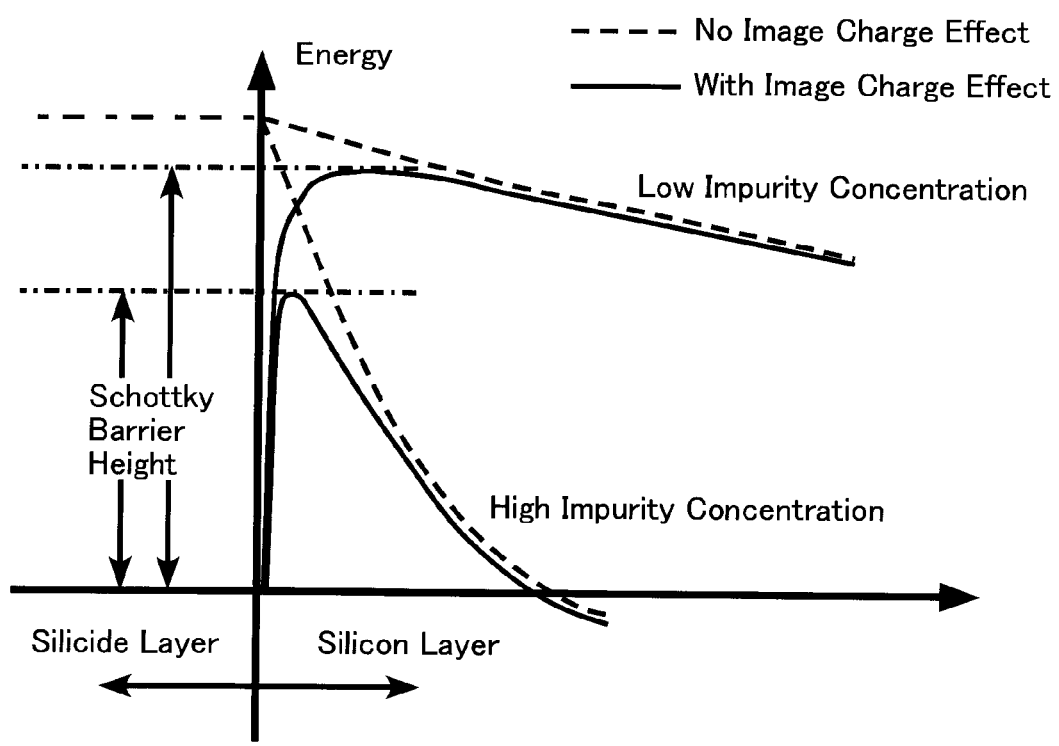
FIG. 6 is a diagram showing a band of the NiSi/Si junction.

FIG. 4 is an enlarged view of a cell part. FIGS. 5 and 6 are diagrams each showing a band of the NiSi/Si junction. As shown in FIG. 4, each cell includes a NiSi layer (second conductor), a high impurity concentration region provided on the Si layer side of an interface between the NiSi layer and the Si layer (semiconductor layer), and a Si region as a semiconductor region sandwiched by the high impurity concentration regions. In the embodiment, the cell functions as a resonant tunnel element as will be described later. The NiSi/Si junction is generally called a Schottky junction and has a band structure as shown in FIG. 5. It is known that, as shown in FIG. 6, the higher the impurity concentration on the Si layer side of the interface is, the stronger bending of the conduction band edge is, and the Schottky barrier height becomes effectively lower.

Consequently, in the cell, a quantum well sandwiched by two Schottky barriers is formed. In the quantum well, a resonant tunneling level is formed as shown in FIG. 4. When a voltage at which the Fermi level of the NiSi grain on the side of injecting an electron coincides with the resonant tunneling level is applied across the NiSi grains, a state where an electron passes very easily is realized. Therefore, as the voltage increases, the current value also increases. At the voltage which coincides with the resonant level, the current value becomes the maximum value (hereinbelow, peak current).

When the voltage is further applied, the current value is deviated from the resonant tunneling level, so that the current value sharply decreases to the minimum value (hereinbelow, called valley current). However, when voltage is further applied, the amount of electrons injected increases, so that the current value rises again. That is, when voltage is applied across the NiSi grains constructing a cell, a nonlinear current-voltage characteristic as shown in the graph of FIG. 4 is expected to be shown. However, generally, there are a plurality of resonant tunneling levels, and a plurality of pairs of peak current/valley current appear. On the top face of the semiconductor layer 10 in the semiconductor device shown in FIG. 1, cells as resonant tunnel elements having the nonlinear current-voltage characteristic construct a network.

As shown in FIG. 1, an electron injected from the input terminal 12a tunnels to the NiSi grain 18, performs hopping conduction while tunneling a way between the NiSi grains 18, and goes out from the other input terminal 12b. In the case where the cell expresses a straight-line (linear) current-voltage characteristic, with respect to constant current I, the voltage on the output side simply drops like $V_2$, $(V_1+2V_2)/3$, $(2V_1+V_2)/3$, and $V_1$ from right.

Figure 7:
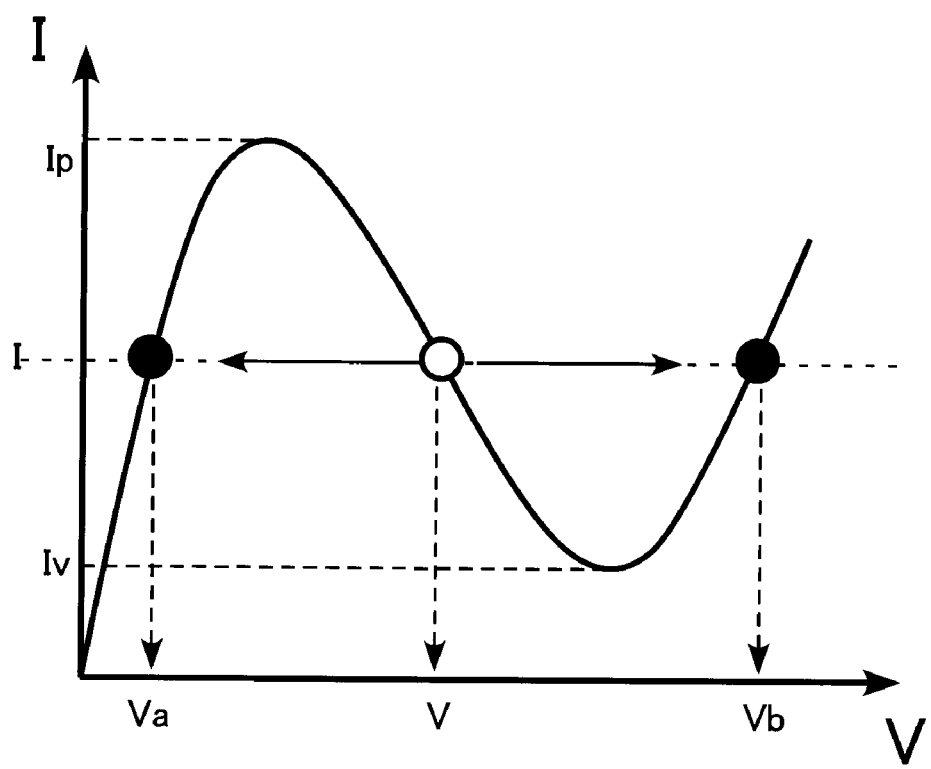
FIG. 7 is a diagram showing current-voltage characteristics of the cell of the first embodiment.

FIG. 7 is a diagram showing the current-voltage characteristic in the case where the cell is the resonant tunnel element. The current-voltage characteristic of the cell is a nonlinear current-voltage characteristic as shown in FIG. 7. Even if constant current I flows in the semiconductor layer 10, two different voltages $V_a$ and $V_b$ ($V_a \ll V_b$) exist. Consequently, not a constant voltage drop but a sharp voltage change can occur. In other words, a region of a small voltage change and a region of a large voltage change are thought to be created. Therefore, in the case where a voltage corresponding to the density of an image is applied from the input-side electrode, the edge reinforcement effect is expected.

By such a nonlinear current-voltage characteristic of the resonant tunnel element, the signal complementation function of the embodiment described with reference to FIG. 2 is realized. Therefore, even when the number of pixels remains the same, that is, the number of input terminals remains the same, an image of quality equivalent to that in the case where the pixel size is effectively reduced can be obtained.

Figure 8:
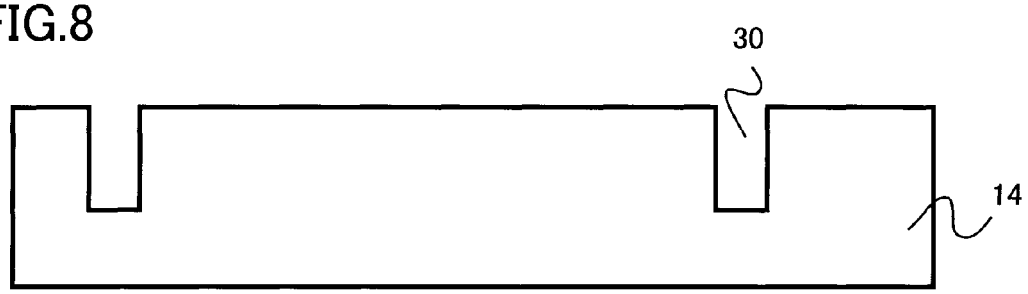
FIGS. 8 to 12 are cross sections showing processes of manufacturing the semiconductor device of the first embodiment.

A method of manufacturing the semiconductor device shown in FIG. 1 will now be described. First, as shown in FIG. 8, on the n-type Si substrate 14 having impurity concentration of about $1\times10^{15}$ atoms/cm$^3$ and having the (100) face as a main face, an opening 30 for forming a plug structure as an input terminal is formed by a known process.

Figure 9:
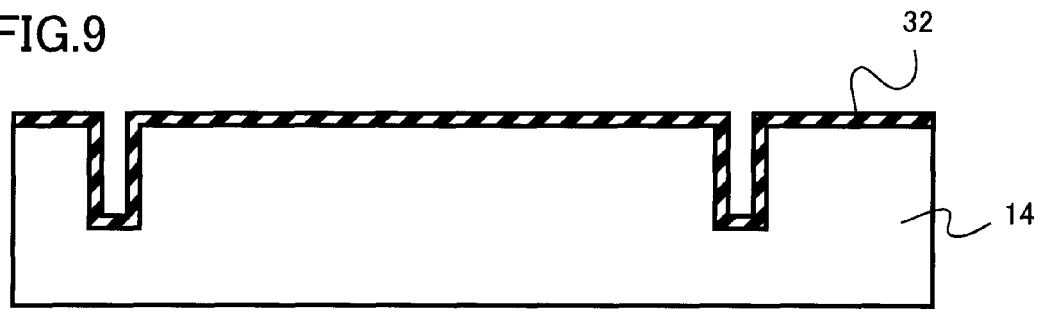
Figure 10:
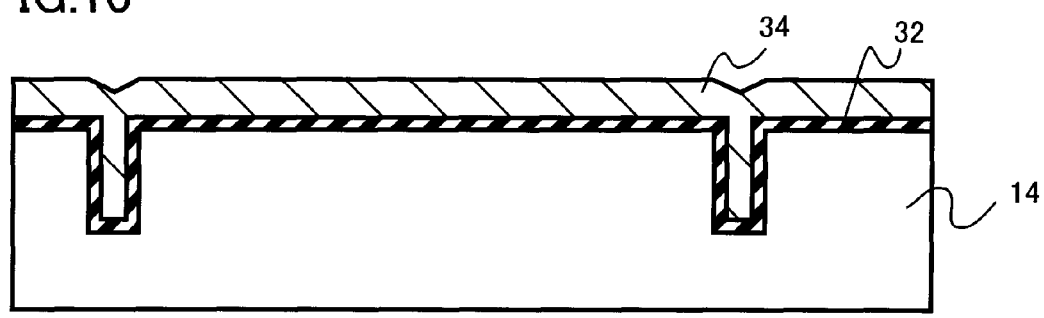

Next, as shown in FIG. 9, on the Si substrate 14, for example, an Si oxide film 32 is formed by CVD or the like. After that, as shown in FIG. 10, a Ni film 34 is deposited by sputtering or the like.

Figure 11:
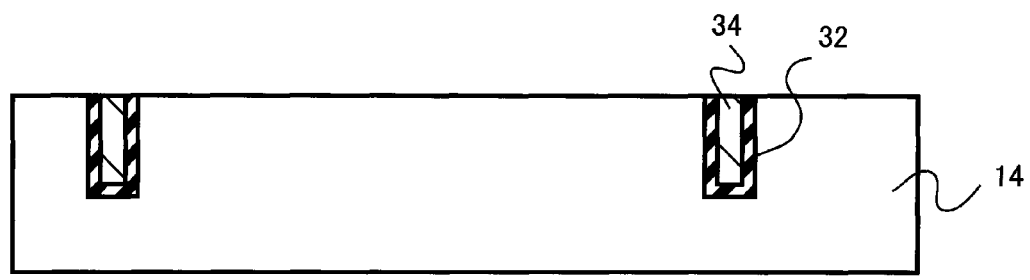
Figure 12:
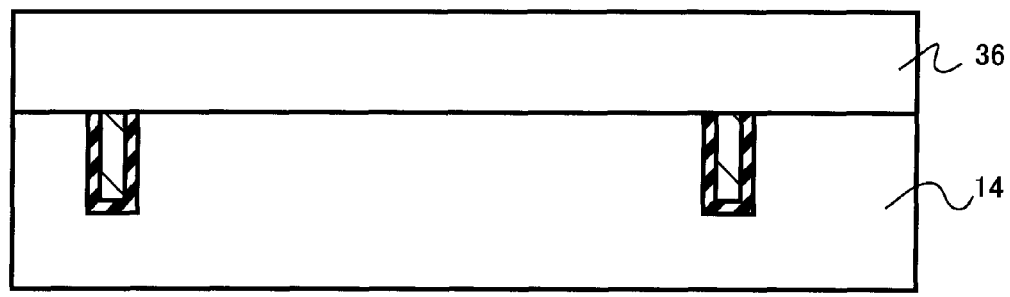

As shown in FIG. 11, by removing the residual Ni film 34 and Si oxide film 32 by CMP or the like, a plug structure is formed. Further, as shown in FIG. 12, an n-type Si film 36 having impurity concentration of about $1\times10^{15}$ atoms/cm$^3$ is formed on the Si substrate 14 by the epitaxial growth method or the like.

Figure 13:
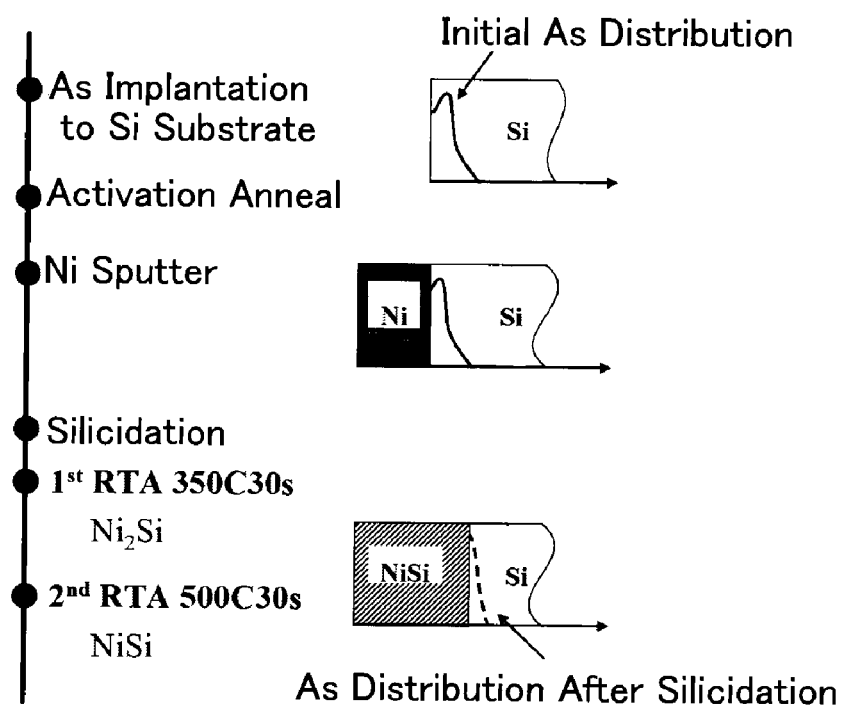
FIG. 13 is a process flowchart of the semiconductor device of the first embodiment.

Next, NiSi is formed on the n-type Si film 36. FIG. 13 is a process flowchart showing an example of silicide process. By applying such silicide process, NiSi can be formed.

Figure 14:
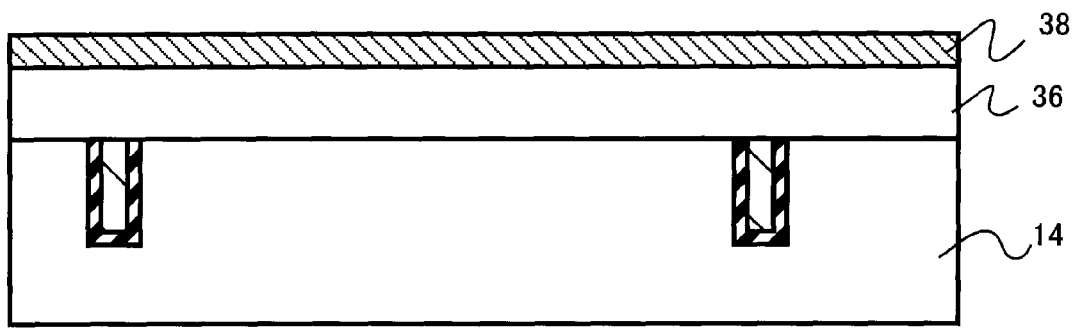
FIGS. 14 to 18 are cross sections showing processes of manufacturing the semiconductor device of the first embodiment.

First, as shown in FIG. 14, As of $10^{18}$ atoms/cm$^3$ is doped on the n-type Si film 36 by ion injection, thereby forming a low-concentration As layer 38 of about $10^{18}$ atoms/cm$^3$. The low-concentration As layer 38 is formed to make snow plow effect of As easily occur so that an As region of higher concentration is formed later. It is also possible to use a silicon substrate as it is originally doped with As. Next, activation annealing (spike annealing) is performed at a temperature of, for example, 1,050° C.

Figure 15:
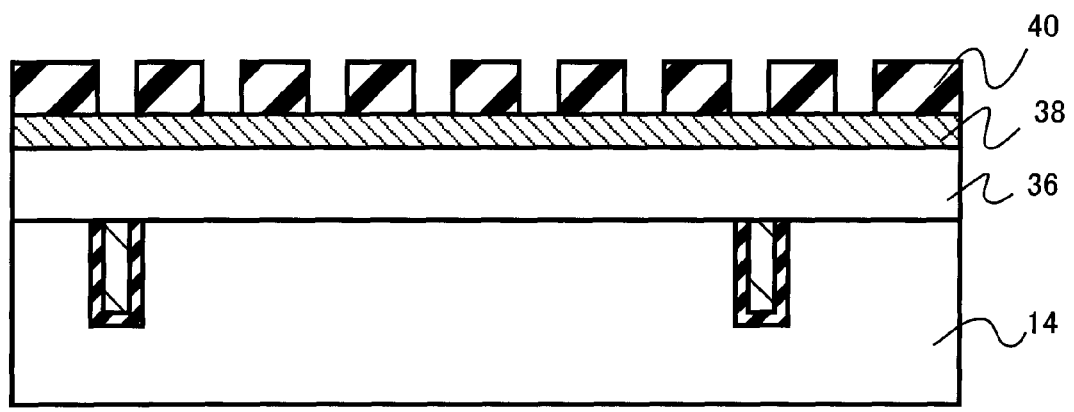
Figure 16:
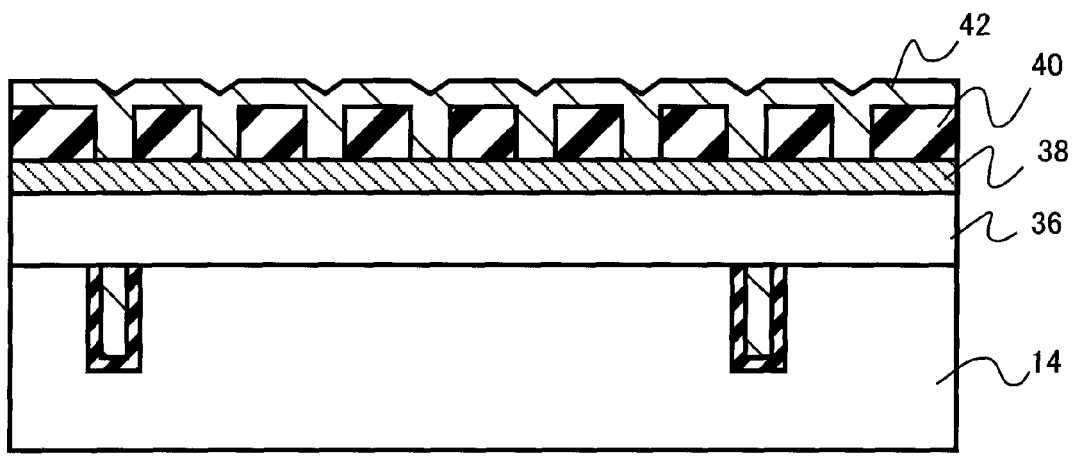

As shown in FIG. 15, Si oxide films ($SiO_2$ films) 40 each having, for example, a width of 50 nm are formed at 50 nm intervals by lithography. After that, as shown in FIG. 16, an Ni film 42 is sputtered.

Figure 17:
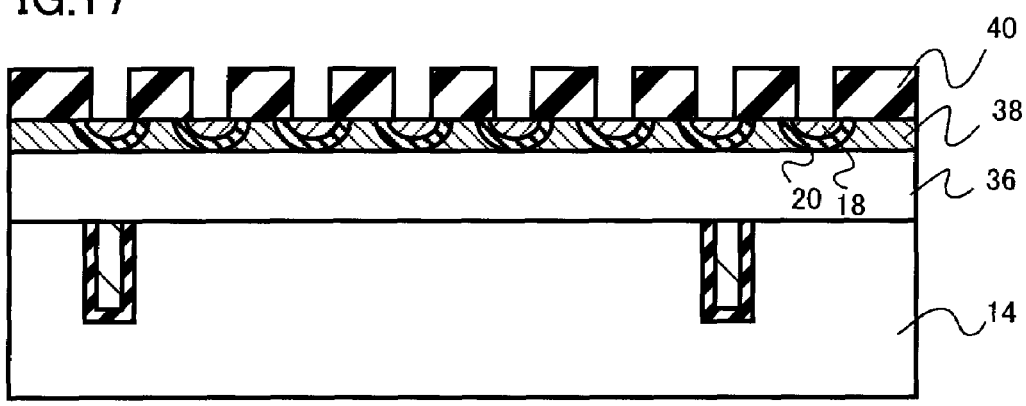

As shown in FIG. 17, for example, annealing of 350° C. for 30 seconds and 500° C. for 30 seconds is performed. After that, for example, with a mixture of concentrated sulfuric acid and hydrogen peroxide water, selective peeling of residual Ni is performed. At this time, by the snow plow effect of As, the high-concentration As region 20 is naturally formed around the NiSi grain 18. Generally, the concentration of the high-concentration As region 20 is about $10^{20}$ atoms/cm$^3$. The NiSi grains 18 are also formed under the $SiO_2$ film 40.

Figure 18:
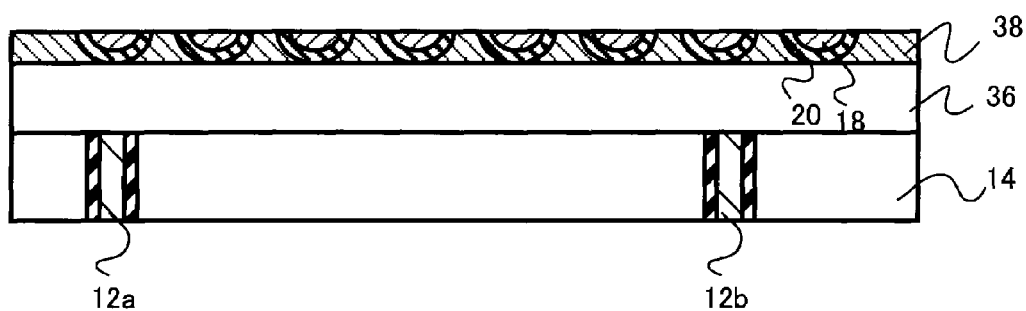

As shown in FIG. 18, the $SiO_2$ film 40 is selectively peeled off by hydrofluoric acid, and the Si film 36 in which the NiSi grains 18 are dispersed is completed. The under face side of the Si substrate 14 is polished by CMP to expose the plugs which become the input terminals 12a and 12b. On the Si film 36, first, the $SiO_2$ films 40 each having a width of 50 nm are formed at 50 nm intervals by lithography. After that, by performing ion implantation of As from an oblique direction, an area having an As concentration of $10^{18}$ atoms/cm$^3$ can be formed.

Ni is sputtered and silicide formation is performed. Since the low-concentration As layer became amorphous by ion implantation of As, more Ni grains grow under the $SiO_2$ film 40, and the distance between the NiSi grains 18 can be desirably and arbitrarily narrowed.

Figure 19:
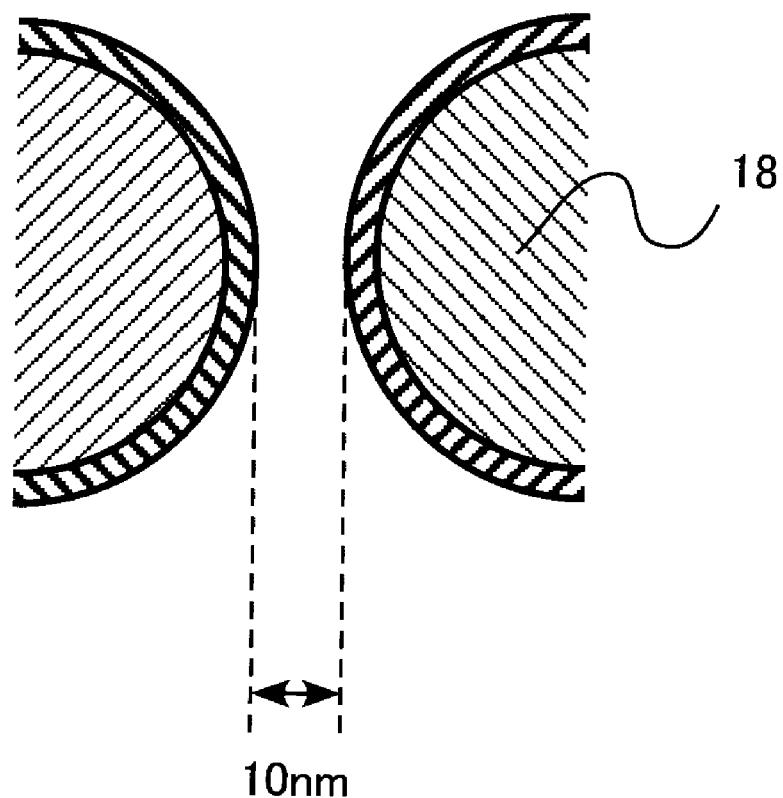
FIG. 19 is a top view of NiSi grains of the first embodiment.

FIG. 19 is a top view of NiSi grains which can be formed by the ion implantation of As in the oblique direction. That is, by adjusting an amount of Ni to be dispersed (film thickness of Ni), the structure in which the interval between neighboring NiSi grains is 10 nm as shown in FIG. 19 can be realized.

Figure 20:
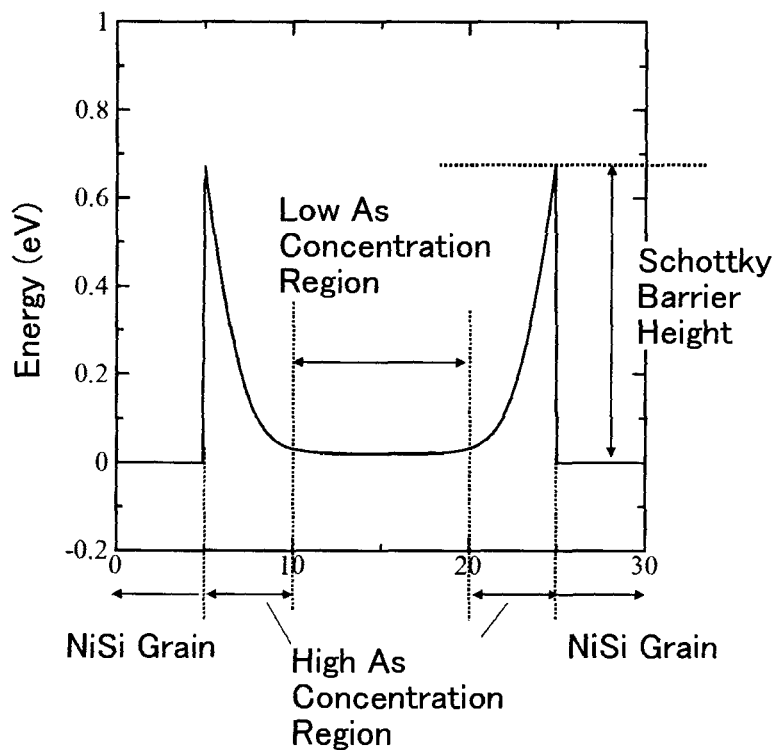
FIG. 20 shows a result of calculation of a conduction band edge in a cell structure of the first embodiment.
Figure 21:
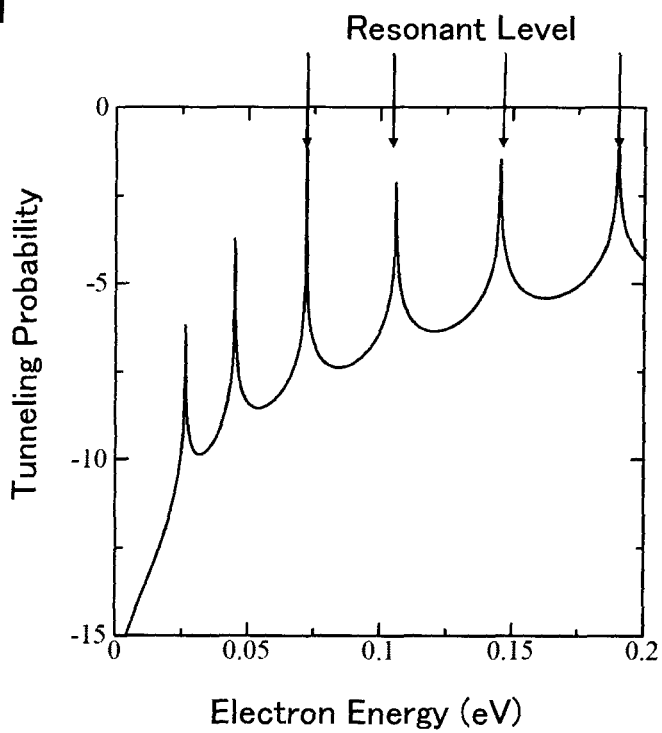
FIG. 21 shows a result of calculation of transmittance by tunnel effect in the cell structure of the first embodiment.

FIG. 20 shows a result of calculating the conduction band edge in the cell structure of FIG. 19 by the Poisson equation. FIG. 21 shows a result of calculation of transmittance by tunnel effect in the cell structure of FIG. 19. It is shown that by calculating the tunneling probability (or the transmittance by tunnel effect) between the NiSi grains with a free electron model, a plurality of resonant levels appear as shown in FIG. 21. Further, by measuring the current-voltage characteristic between the NiSi grains shown in FIG. 20, the resonant tunnel characteristic can be recognized.

Figure 22:
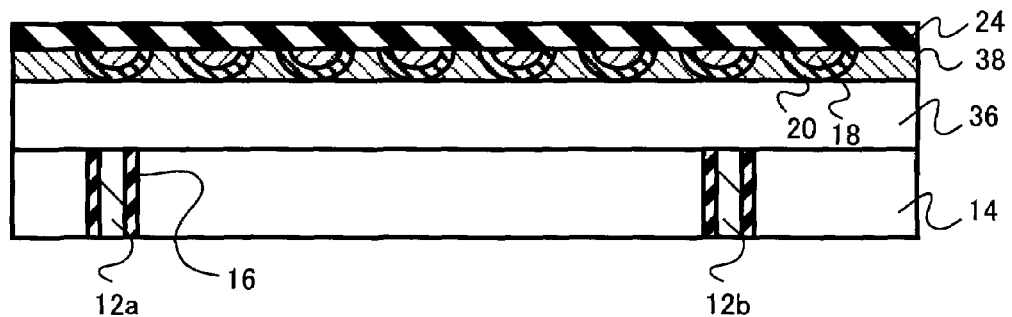
FIGS. 22 and 23 are cross sections showing processes of manufacturing the semiconductor device of the first embodiment.
Figure 23:
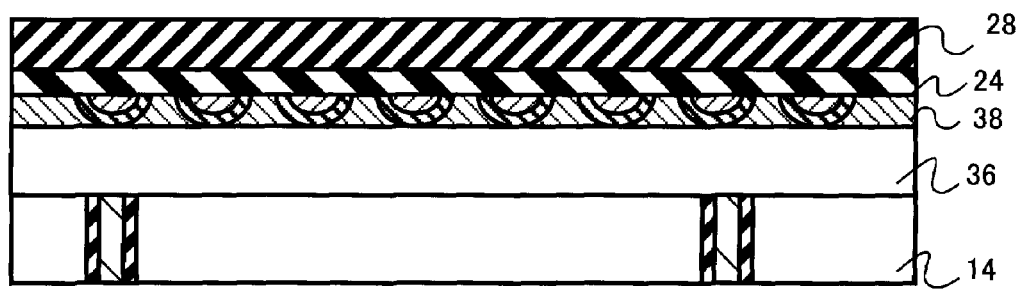

As shown in FIG. 22, the high-dielectric-constant film 24 is deposited by, for example, CVD. After that, as shown in FIG. 23, for example, by CVD, the Si oxide film 28 is deposited. A contact hole is opened in the Si oxide film 28 by a known process technique and a metal electrode serving as an output terminal is formed. In such a manner, the semiconductor device of FIG. 1 is formed.

Second Embodiment

A semiconductor device of a second embodiment includes: a solid-state image sensing device formed on one of main faces of a semiconductor substrate; a semiconductor layer on the other main face of the semiconductor substrate; a plurality of first conductors penetrating the semiconductor substrate, connected to one of faces of the semiconductor layer, and serving as input terminals to which an image signal from the solid-state image sensing device is input; second conductors of the number larger than that of the first conductors formed at density higher than that of the first conductors, on the other face of the semiconductor layer; a high impurity concentration region provided on the semiconductor layer side of an interface between the second conductor and the semiconductor layer; an insulating layer formed on the other face; and a plurality of third conductors formed on the insulating layer and serving as output terminals for outputting the processed image signal.

The semiconductor device of the embodiment has a configuration that an image signal from the solid-state image sensing device is input to the input terminal in the semiconductor device of the first embodiment. Therefore, content overlapping the first embodiment will not be described.

Figure 24:
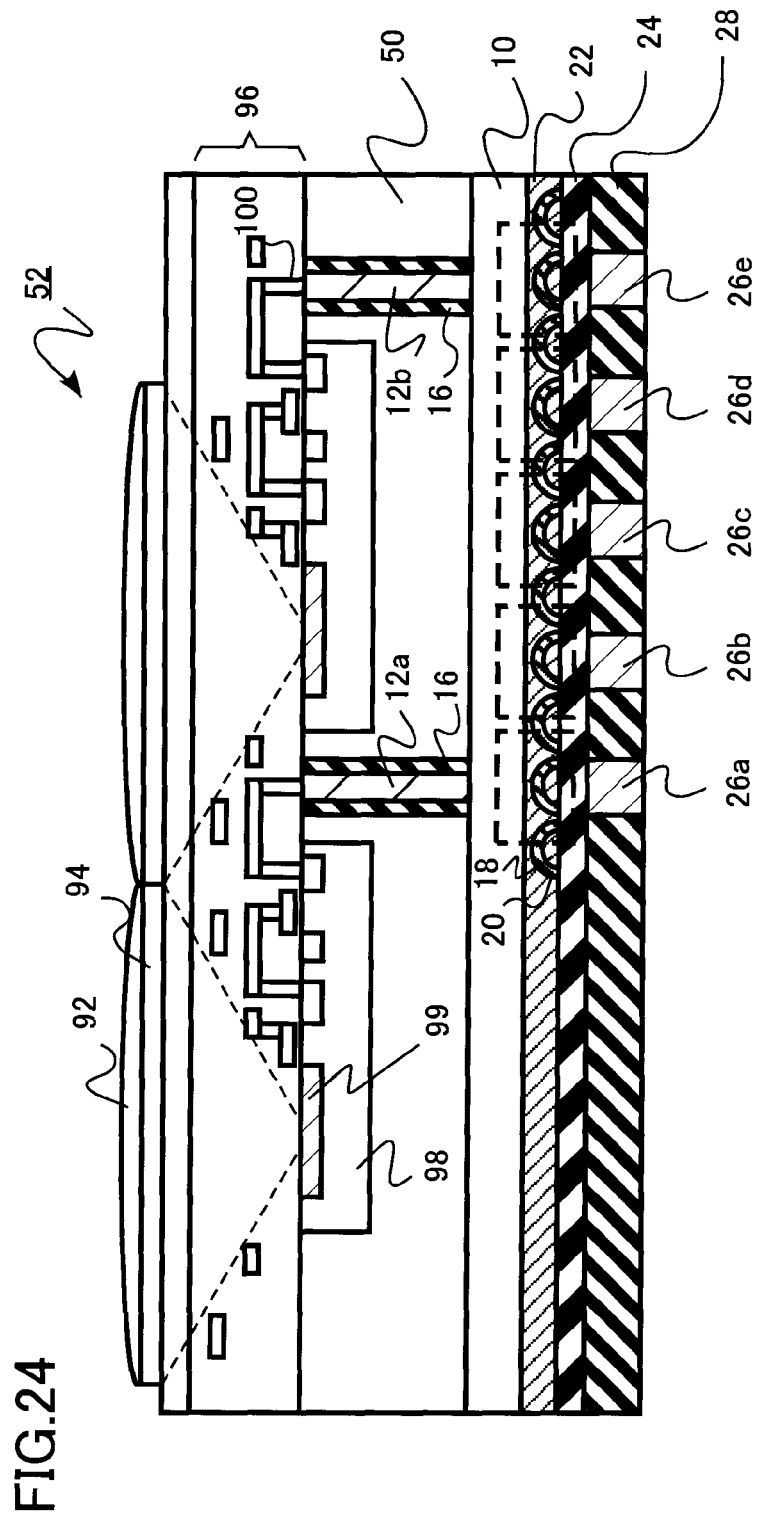
FIG. 24 is a cross section of a semiconductor device of a second embodiment.

FIG. 24 is a cross section of the semiconductor device of the embodiment. A surface-illuminated CMOS image sensor 52 as a solid-state image sensing device is formed on one of main faces of a semiconductor substrate 50 of, for example, n-type Si. In the CMOS image sensor 52, a plurality of unit cells (pixels) on the semiconductor substrate 50 are formed. In each of the unit cells (pixels) of the CMOS image sensor 52, a color filter 94 is formed under a microlens 92. Through a metal wiring layer 96 below the color filter 94, light is focused in a photodiode 99 as a photoelectric conversion device formed in a P-well 98 in the Si substrate 50. Some field effect transistors such as a transistor for transferring charges generated by the photodiode 99 and converting to voltage are formed on the semiconductor substrate 50 every unit cell and are connected to a wire of the metal wiring layer 96.

The semiconductor layer 10 of, for example, n-type Si is formed on the other main face of the semiconductor substrate 50. The semiconductor device also has a plurality of input terminals 12a and 12b penetrating the semiconductor substrate 50, connected to one of faces of the semiconductor layer 10, and to which image signals from the pixels in the CMOS image sensor 52 are input through an output electrode 100. The input terminals 12a and 12b are electrically insulated from the semiconductor layer 10 by the insulating layer 16.

The NiSi (nickel monosilicide) grains 18 of the number larger than that of the input terminals 12a and 12b at number density higher than that of the input terminals 12a and 12b are formed on the other face of the semiconductor layer 10. The high impurity concentration region 20 is provided on the semiconductor layer 10 side of an interface between the NiSi grains 18 and the semiconductor layer 10. In the embodiment, in the entire region where the NiSi grains 18 are formed, the low impurity concentration layer 22 of about $1 \times 10^{18}$ atoms/cm³ is formed.

On the other face of the semiconductor layer 10, the high-dielectric-constant insulating film 24 is formed as an insulating layer. Further, on the high-dielectric-constant insulating film 24, a plurality of, for example, five output terminals 26a, 26b, 26c, 26d, and 26e made of a metal such as Ni or Al are formed in the insulating film 28 on the high-dielectric-constant insulating film 24.

In the semiconductor device of the embodiment, at the time of obtaining an image captured by the CMOS image sensor 52, even when the number of pixels under the present condition is maintained, an effect similar to that in the case where the number of pixels is effectively increased can be obtained. In addition, the correcting process is performed by hardware means, so that the edge process can be performed at high speed.

In the embodiment, preferably, the CMOS image sensor 52 has: a plurality of photodiodes 99; the output electrode 100 for outputting signals obtained by the photodiodes 99 to the input terminals 12a and 12b; and a buffer circuit connected between the photodiodes 99 and the output electrode 100 and controlling current which flows from the input terminals 12a and 12b to the photodiodes 99.

Figure 25:
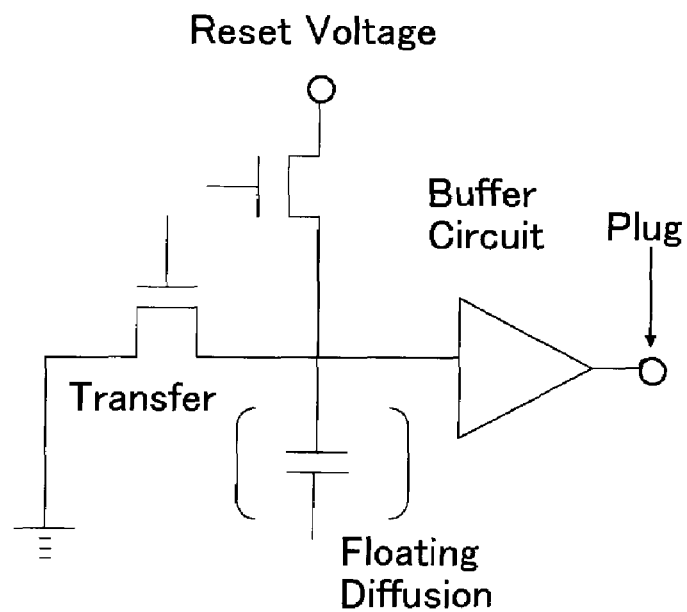
FIG. 25 is an equivalent circuit diagram of the semiconductor device of the second embodiment.
Figure 26:
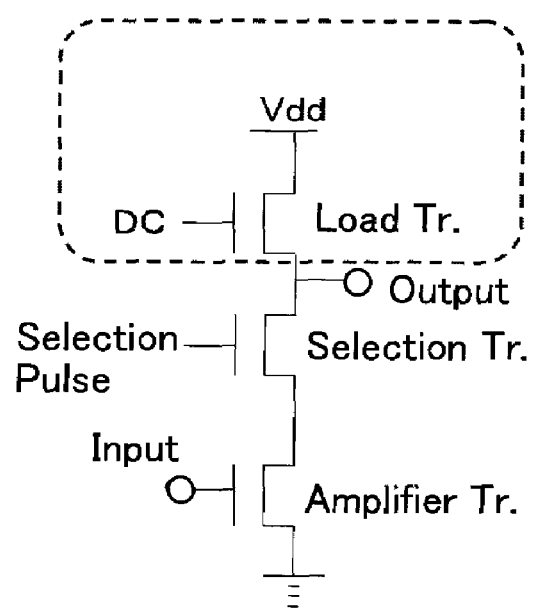
FIG. 26 is a diagram showing an example of a buffer circuit of the second embodiment.

FIG. 25 shows an example of an equivalent circuit diagram of a CMOS image sensor having such a buffer circuit. The buffer circuit part has a structure that does not exert an influence on charges taken from the photoelectric conversion device at the time of taking voltage from the plugs (the input terminals 12a and 12b in FIG. 24). FIG. 26 shows a part of the buffer circuit. A part surrounded by broken line can be formed on the outside of a pixel, and the other part has to be formed in a pixel.

The semiconductor device of FIG. 24 can be manufactured by forming each of the semiconductor substrate 50 having the plug structures of the input terminals 12a and 12b and the CMOS image sensor 52, and the semiconductor layer 10 having the NiSi grains 18 and the output terminals 26a, 26b, 26c, 26d, and 26e and joining the semiconductor substrate 50 and the semiconductor layer 10 later.

Third Embodiment

A semiconductor device of a third embodiment is similar to that of the first embodiment except for the point that $NiSi_2$ grains are formed on an Si substrate having a (111) face as a main face. Therefore, overlapping content will not be described.

Figure 27:
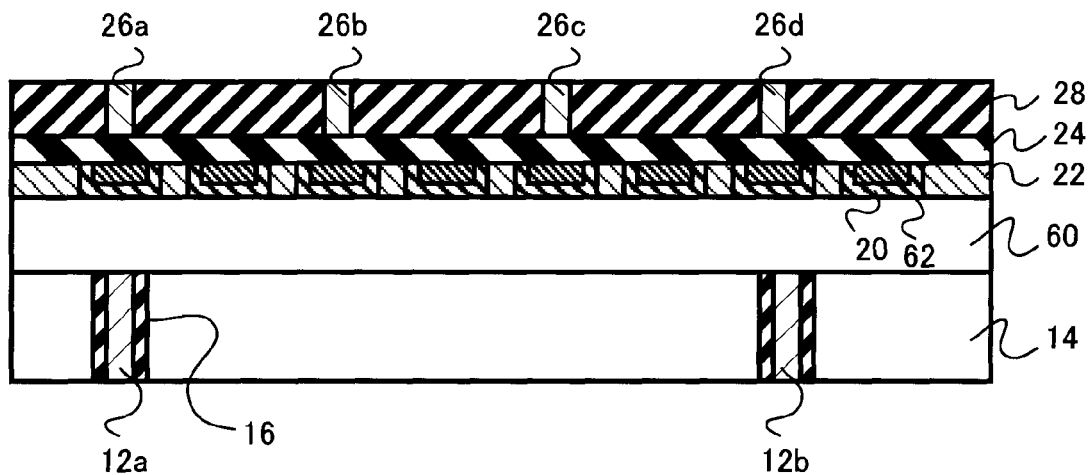
FIG. 27 is a cross section of a semiconductor device of a third embodiment.

FIG. 27 is a cross section of the semiconductor device of the third embodiment. In place of the NiSi grains in the first embodiment, $NiSi_2$ (nickel disilicide) grains 62 are formed. A semiconductor substrate 60 is a Si substrate having a (111) face as a main face.

In the embodiment, the $NiSi_2$ grains are epitaxially grown on the Si substrate, so that rectangular grains are formed. It becomes easy to avoid a problem such that the grains come into contact and, in addition, an excellent resonant tunnel characteristic is expected.

Figure 28:
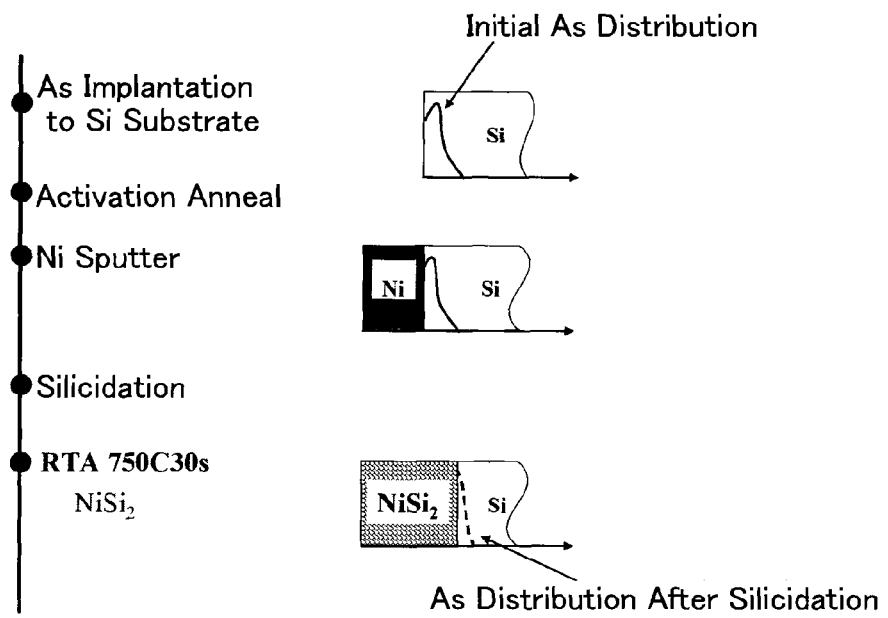
FIG. 28 is a process flowchart of the semiconductor device of the third embodiment.

FIG. 28 is a diagram showing the process flow of the semiconductor device of the embodiment. When silicide formation at 750° C. for 30 seconds is performed as shown in FIG. 28 after the process of FIG. 15 of the first embodiment, $NiSi_2$ grains are formed.

Fourth Embodiment

A semiconductor device of a fourth embodiment is similar to that of the first embodiment except for the point that PtSi grains are formed. Therefore, overlapping content will not be described.

Figure 29:
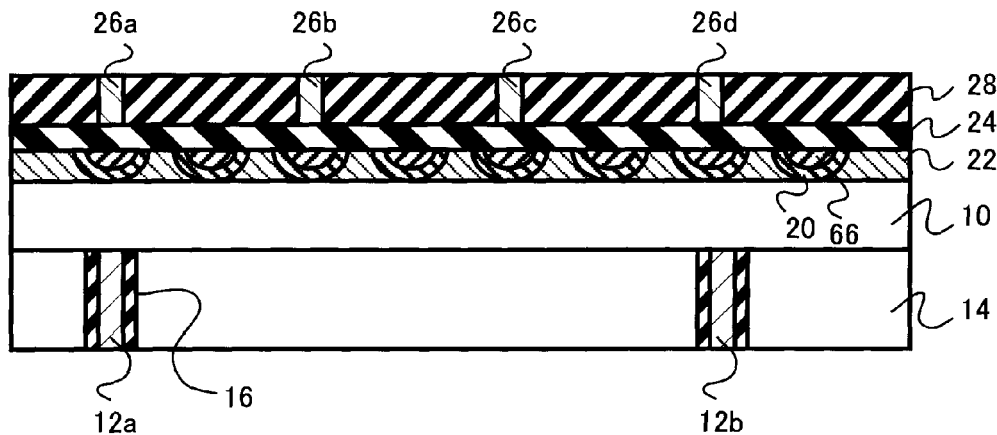
FIG. 29 is a cross section of a semiconductor device of a fourth embodiment.

FIG. 29 is a cross section of the semiconductor device of the fourth embodiment. In place of the NiSi grains in the first embodiment, PtSi grains 66 are formed.

In the embodiment, the height of the barrier of a PtSi/Si Schottky interface for an electron is about 0.9 eV, so that the confining effect in the Si layer is stronger than that in the case of NiSi. Therefore, an excellent resonant tunnel characteristic in which the ratio of peak current/valley current is high can be expected.

Figure 30:
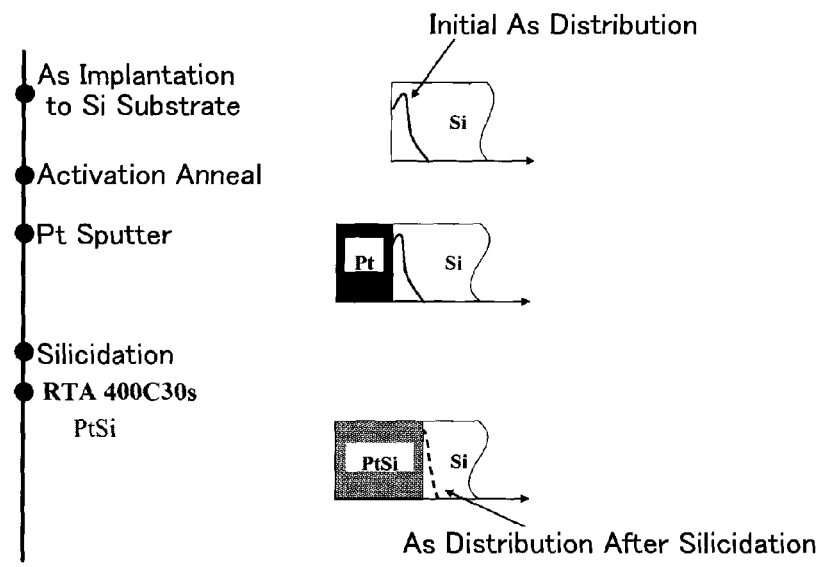
FIG. 30 is a process flowchart of the semiconductor device of the fourth embodiment.
Figure 31:
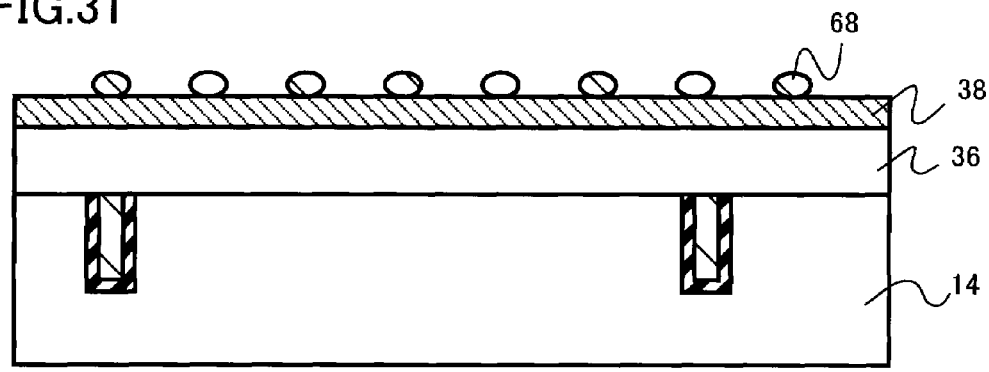
FIG. 31 is a cross-section showing a manufacturing process of a semiconductor device of a fifth embodiment.

FIG. 30 is a diagram showing the process flow of the semiconductor device of the embodiment. When silicide formation at 400° C. for 30 seconds is performed as shown in FIG. 31 after the process of FIG. 15 of the first embodiment, PtSi grains are formed. Further, when residual Pt is selectively peeled with a chemical (aqua regia of 70° C. or higher) and, after that, an $SiO_2$ film is selectively peeled off with hydrofluoric acid, an Si film in which PtSi grains are dispersed is formed.

Fifth Embodiment

A method of manufacturing a semiconductor device of a fifth embodiment is similar to the manufacturing method of the first embodiment except for the following point. In the silicide formation process, a liquid obtained by dissolving Ni grains and a dispersant (polyacrylic acid) into an organic solvent (ethylene glycol) is applied on an Si substrate by a spinner in place of sputtering of Ni. Therefore, content overlapping the first embodiment will not be described.

Figure 32:
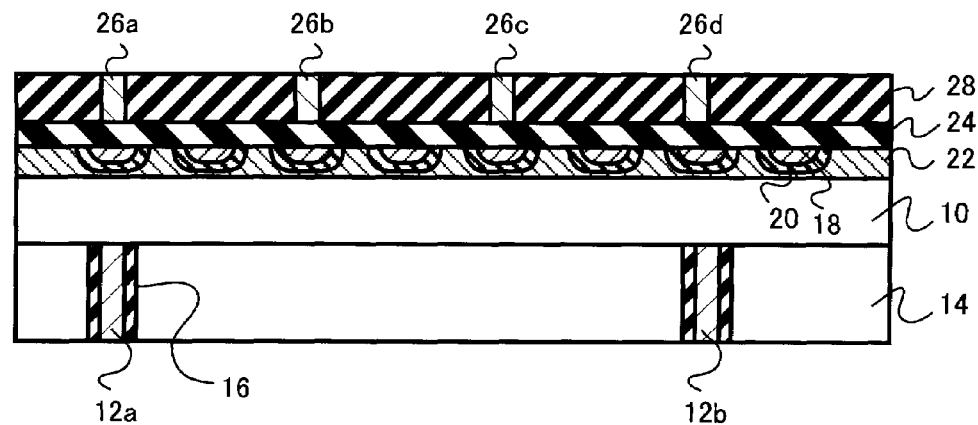
FIG. 32 is a cross section of a semiconductor device manufactured by a method of manufacturing a semiconductor device of the fifth embodiment.

FIG. 31 is a cross-section showing a manufacturing process of the embodiment. FIG. 32 is a cross section of a semiconductor device manufactured by a manufacturing method of the embodiment. The diameter of an Ni grain 68 is about 10 nm. After that, ethylene glycol is volatilized while performing vacuuming at 200° C., as shown in FIG. 31, the Ni grains 68 can be dispersed over the Si substrate 36.

After that, by performing annealing of 350° C. for 30 seconds and 500° C. for 30 seconds, the NiSi grains can be dispersed over the Si substrate. After that, with a chemical (mixture of concentrated sulfuric acid and hydrogen peroxide water), residual Ni and a dispersant are removed. In such a manner, the semiconductor device of FIG. 32 can be manufactured.

By dispersing the NiSi grains 18 in the Si layer in such a manner, the semiconductor device can be manufactured in a state where the NiSi grains 18 are very close to each other. Operation can be performed at higher temperature and stable resonant tunnel characteristic can be expected.

Sixth Embodiment

A method of manufacturing a semiconductor device of a sixth embodiment is similar to the manufacturing method of the fifth embodiment except that $NiSi_2$ grains are formed on an Si substrate having a (111) face as a main face. Therefore, the overlapping content will not be described.

Figure 33:
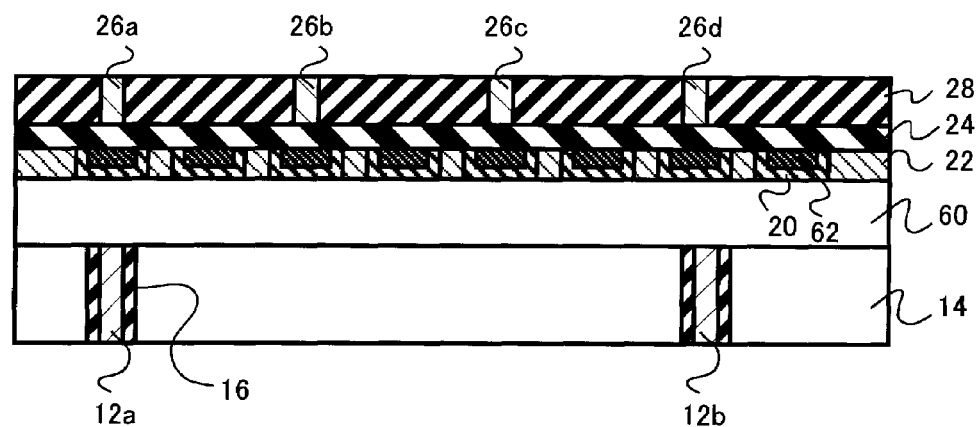
FIG. 33 is a cross section of a semiconductor device of a sixth embodiment.

FIG. 33 is a cross section of a semiconductor device of the embodiment. By dispersing $NiSi_2$ grains in an Si layer by the method of the embodiment, the semiconductor device can be manufactured in a state where the $NiSi_2$ grains are very close to each other and the grains are epitaxially grown over the Si (111) substrate. Thus, the semiconductor device with high controllability can be manufactured.

Seventh Embodiment

A semiconductor device of a seventh embodiment is similar to that of the second embodiment except that a solid-state image sensing device formed on one of main faces of the a semiconductor substrate is a backside illumination CMOS image sensor in place of a surface-illuminated one. Therefore, the overlapping content will not be described.

Figure 34:
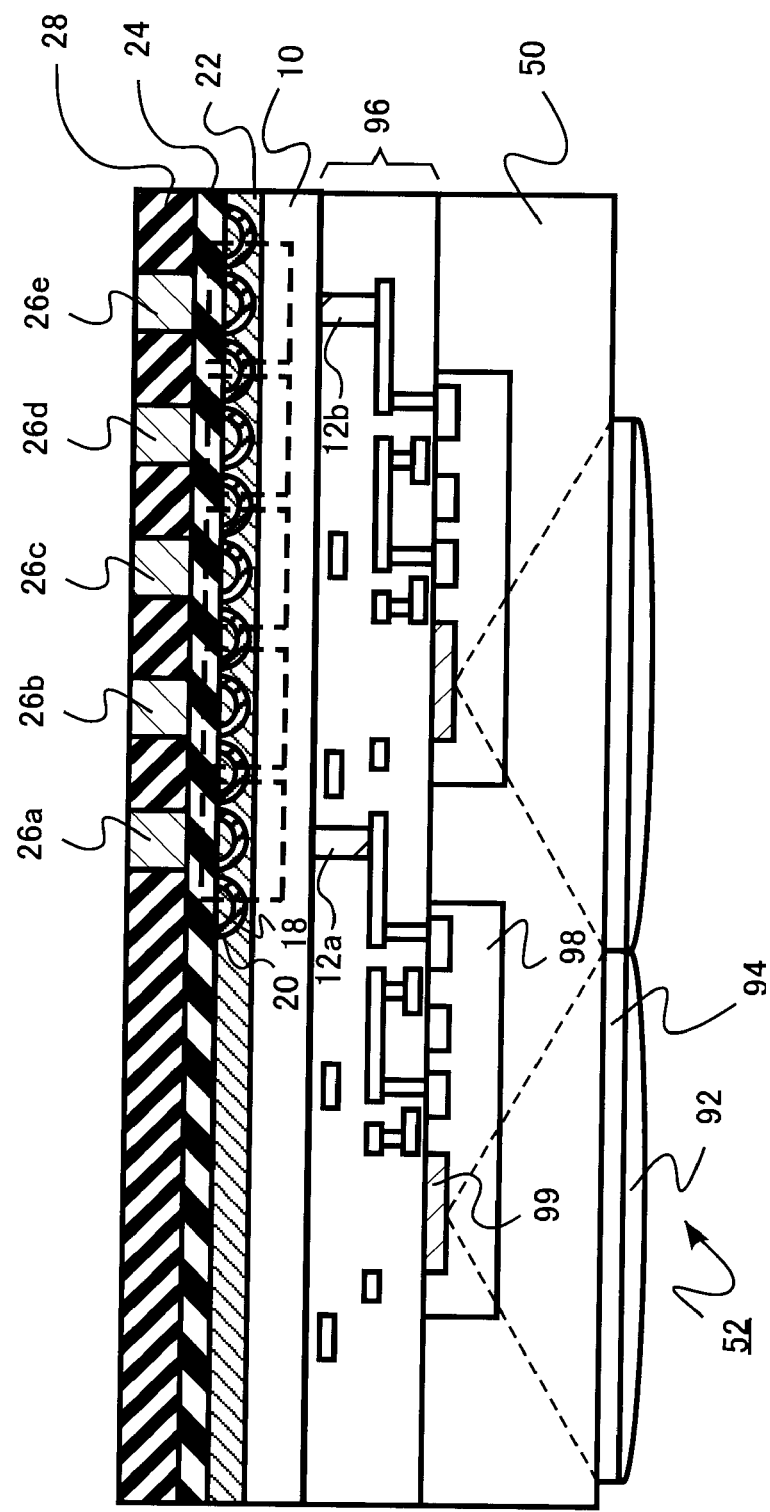
FIG. 34 is a cross section of a semiconductor device of a seventh embodiment.

FIG. 34 is a cross section of the semiconductor device of the embodiment. A backside illumination CMOS image sensor 52 as a solid-state image sensing device is formed on the rear face of a semiconductor substrate 50 of, for example, n-type Si, that is, on the main face on the side opposite to the metal wiring layer 96. In each of the unit cells (pixels) of the CMOS image sensor 52, a color filter 94 is formed under a microlens 92. Through an Si substrate 50 above the color filter 94, light is focused in a photodiode 99 as a photoelectric conversion device formed in a P-well 98. Some field effect transistors such as a transistor for transferring charges generated by the photodiode 99 and converting to voltage are formed on the semiconductor substrate 50 every unit cell and are connected to a wire of the metal wiring layer 96.

The semiconductor layer 10 of, for example, n-type Si is formed on the other main face of the semiconductor substrate 50. The semiconductor device also has a plurality of input terminals 12a and 12b to which image signals from the pixels in the CMOS image sensor 52 are input through the wire in the metal wiring layer 96.

In the embodiment, since the backside illumination CMOS image sensor is used, miniaturization of a pixel is easier as compared with the second embodiment.

Eighth Embodiment

A semiconductor device of an eighth embodiment is similar to that of the first embodiment except that an input signal is an image signal read from a DVD. Therefore, content overlapping the first embodiment will not be described.

Figure 35:
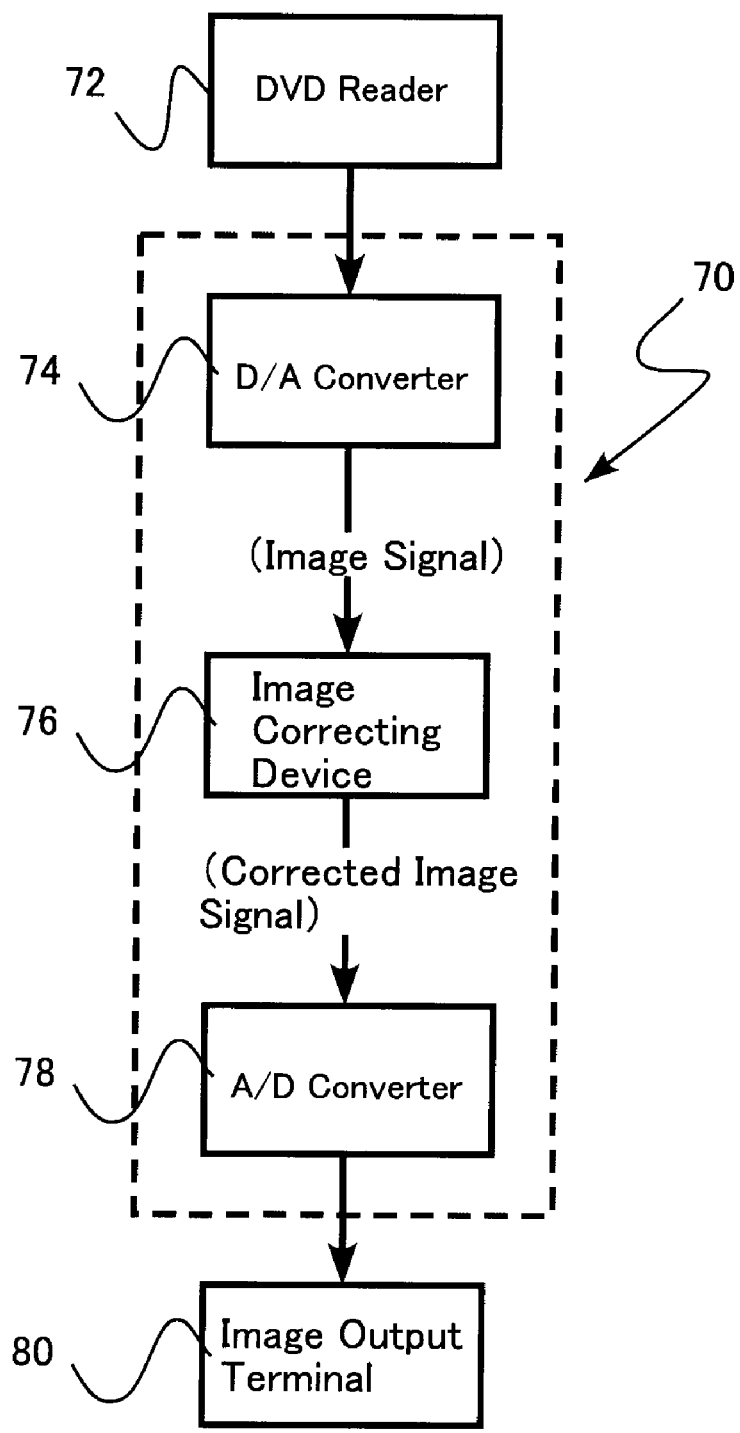
FIG. 35 is a block diagram of a system including a semiconductor device of an eighth embodiment.

FIG. 35 is a block diagram of a system including the semiconductor device of the embodiment. A semiconductor device 70 of the embodiment includes a D/A converter 74 for converting an image signal read and digitized by a DVD reader 72 into an analog signal, an image correcting device 76 for performing edge correction on the analog signal, and an A/D converter 78 for converting an analog corrected image signal again to a digital signal and transmitting the digital signal to an image output terminal 80 such as a television.

In the embodiment, an image read from a DVD can be output as a high-quality DVD video image to the image output terminal without increasing the number of pixels. In the semiconductor device of the embodiment, the A/D converter is not always an essential component.

Ninth Embodiment

A semiconductor device of a ninth embodiment is similar to that of the first embodiment except that a mirror (deformable mirror) is provided on the output terminal side. Therefore, content overlapping the first embodiment will not be described.

Figure 36:
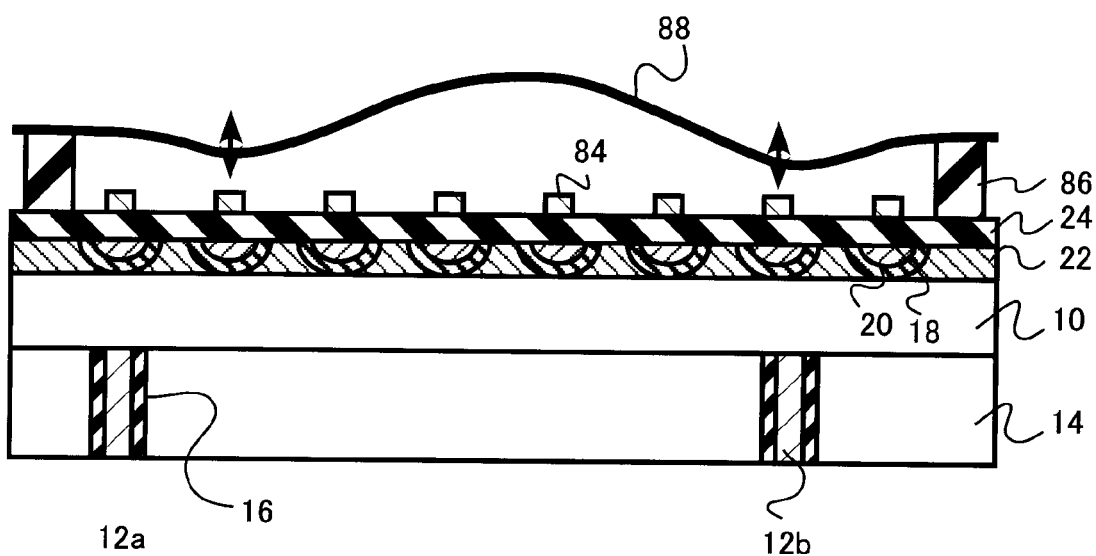
FIG. 36 is a cross section of a semiconductor device of a ninth embodiment.
Figure 37:
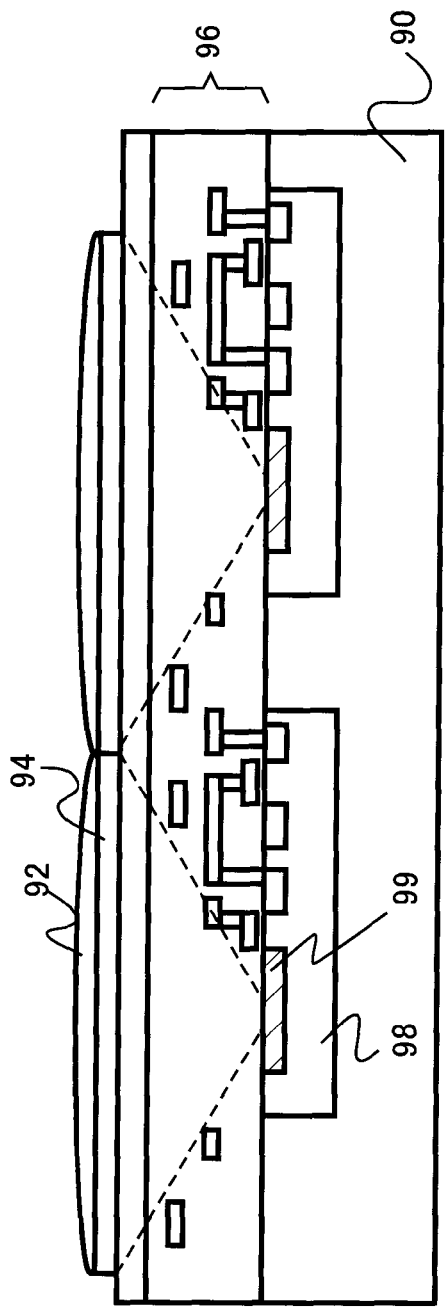
FIG. 37 is a cross section of a general CMOS image sensor.

FIG. 36 is a cross section of the semiconductor device of the embodiment. Over the NiSi grains 18, wires 84 are formed as output terminals via a high-dielectric film 24. Further, a mirror (deformable mirror) 88 supported by spacers 86 is provided above the wires 84.

In the semiconductor device of the embodiment, a voltage distribution obtained by performing successive complementation, edge process and the like on a voltage distribution input from the input terminals 12a and 12b appears in the wire 84 in an upper part. Further, by electrostatic attractive force generated between the mirror 88 and the wire 84, a distortion corresponding to the voltage of the wire 84 is allowed to occur in the mirror 88. By the deformable mirror device, the mirror 88 can be deformed easily so that the wave front of incident line is adjusted. The deformable mirror device is therefore important from the viewpoint of industry.

The embodiments have been described above by the concrete examples. The foregoing embodiments have been stated just as examples and do not limit the present invention. In the description of the embodiments, parts in a semiconductor device, a method of manufacturing a semiconductor device, and the like which are not directly necessary for description of the present invention were not described. However, elements related to the semiconductor device, the method of manufacturing a semiconductor device, and the like which are necessary can be properly selectively used.

Although the semiconductor substrate, the semiconductor layer, and the semiconductor film made of Si have been described as an example, the present invention can be also applied to the other semiconductors such as SiGe, Ge, and a compound semiconductor. Although n-type Si has been mainly described as an example of Si, p-type Si can be also used. Although As has been described as an example of impurity, other impurities such as P, B, and Mg can be applied properly. As a conductor, any metal and metal semiconductor compounds can be applied. Although the CMOS image sensor has been described as an example of the solid-state image sensing device, another solid-state image sensing device can be also applied. Although a photodiode has been described as an example of a photoelectric conversion device, another photoelectric conversion device can be also applied.

All of semiconductor devices having the elements of the present invention and whose design can be changed by a person skilled in the art are included in the scope of the present invention. The scope of the present invention is defined by the scope of claims and the scope of equivalents of the claims.

What is claimed is:

1. A semiconductor device comprising:
   a semiconductor layer;
   a plurality of first conductors formed on one of faces of the semiconductor layer and configured to serve as input terminals to which signals are input;
   a plurality of second conductors formed on the other face of the semiconductor layer, wherein the number of the second conductors is larger than that of the first conductors and the number density of the second conductors is higher than that of the first conductors;
   high impurity concentration regions provided on the semiconductor layer side of interfaces between the second conductors and the semiconductor layer; an insulating layer formed on the second conductors; and
   a plurality of third conductors formed on the insulating layer and configured to serve as output terminals from which the signals processed are output, the third conductors being separated from the second conductors by the insulating layer.

2. The device according to claim 1, wherein the signals are image signals.

3. The device according to claim 2, wherein the image signals are image signals read from a DVD.

4. The device according to claim 1, wherein the number of the output terminals is larger than that of the input terminals.

5. The device according to claim 1, wherein a quantum well is formed between the second conductors.

6. The device according to claim 1, wherein the semiconductor layer is a Si layer, and the second conductors are made of silicide.

7. The device according to claim 1, wherein impurity concentrations of the high impurity concentration regions are $1 \times 10^{20}$ atoms/cm$^3$ or higher.

8. A semiconductor device comprising:
   a semiconductor substrate;
   a solid-state image sensing device formed on one of main faces of the semiconductor substrate;
   a semiconductor layer on the other main face of the semiconductor substrate;
   a plurality of first conductors penetrating the semiconductor substrate, connected to one of faces of the semiconductor layer, and configured to serve as input terminals to which image signals from the solid-state image sensing device are input;
   a plurality of second conductors formed on the other face of the semiconductor layer, wherein the number of the second conductors is larger than that of the first conductors and the number density of the second conductors is higher than that of the first conductors;
   high impurity concentration regions provided on the semiconductor layer side of interfaces between the second conductors and the semiconductor layer;
   an insulating layer formed on the second conductors; and
   a plurality of third conductors formed on the insulating layer configured to serve as output terminals from which the signals processed are output, the third conductors being separated from the second conductors by the insulating layer.

9. The device according to claim 8, wherein the solid-state image sensing device comprises:
   a plurality of photoelectric conversion elements;
   a plurality of output electrodes configured to output a signals obtained by the photoelectric conversion elements to the input terminal; and
   a plurality of buffer circuits connected between the photoelectric conversion elements and the output electrodes and configured to control current which flows from the input terminals to the photoelectric conversion elements.

10. The device according to claim 8, wherein the number of output terminals is larger than that of the input terminals.

11. The device according to claim 8, wherein a quantum well is formed between the second conductors.

12. The device according to claim 8, wherein the semiconductor layer is a Si layer, and the second conductors are made of silicide.

13. The device according to claim 8, wherein impurity concentrations of the high impurity concentration regions are $1 \times 10^{20}$ atoms/cm$^3$ or higher.

14. The device according to claim 1, wherein the insulating layer is a high-dielectric-constant insulating film.

15. The device according to claim 8, wherein the insulating layer is a high-dielectric-constant insulating film.

16. The device according to claim 1, wherein the first conductors and second conductors are separated by the semiconductor layer.

17. The device according to claim 8, wherein the first conductors and second conductors are separated by the semiconductor layer.

18. The device according to claim 1, wherein the number of the third conductors is smaller than that of the second conductors.

19. The device according to claim 8, wherein the number of the third conductors is smaller than that of the second conductors.

20. The device according to claim 6, wherein the silicide is nickel monosilicide (NiSi).

* * * * *